United States Patent
Foroudi

(10) Patent No.: US 8,400,205 B2
(45) Date of Patent: Mar. 19, 2013

(54) APPARATUS AND METHOD FOR LINEARIZING FIELD EFFECT TRANSISTORS IN THE OHMIC REGION

(75) Inventor: Omid Foroudi, Greensboro, NC (US)

(73) Assignee: Analog Devices, Inc., Norwood, MA (US)

( * ) Notice: Subject to any disclaimer, the term of this patent is extended or adjusted under 35 U.S.C. 154(b) by 124 days.

(21) Appl. No.: 13/082,803

(22) Filed: Apr. 8, 2011

(65) Prior Publication Data
US 2012/0256674 A1    Oct. 11, 2012

(51) Int. Cl.
*H03L 5/00* (2006.01)
(52) U.S. Cl. ....................... 327/308; 327/427
(58) Field of Classification Search .................. 327/427, 327/365, 376, 377, 307, 308
See application file for complete search history.

(56) References Cited

U.S. PATENT DOCUMENTS

| | | | |
|---|---|---|---|
| 7,205,817 B1 * | 4/2007 | Huang et al. | 327/308 |
| 7,710,189 B2 * | 5/2010 | Toda | 327/434 |
| 7,750,716 B2 * | 7/2010 | Hosoya | 327/308 |
| 8,149,042 B2 * | 4/2012 | Nakahara et al. | 327/308 |

* cited by examiner

*Primary Examiner* — Hai L Nguyen
(74) *Attorney, Agent, or Firm* — Knobbe, Martens, Olson & Bear, LLP

(57) ABSTRACT

Apparatus and methods are disclosed related to using one or more field effect transistors as a resistor. One such apparatus includes a field effect transistor with a first series circuit in parallel with the gate and the source of the field effect transistor and a second series circuit in parallel with the gate and the drain of the field effect transistor. Each series circuit can include a capacitor and a switch in series with the capacitor. The switch can be configured to be on when the field effect transistor is on, and to be off when the field effect transistor is off. This can improve the linearity of the field effect transistor as a resistor. In some implementations, the apparatus can further include an isolation resistor having a first end and a second end, the first end electrically coupled to the gate of the field effect transistor.

20 Claims, 8 Drawing Sheets

APPARATUS AND METHOD FOR LINEARIZING FIELD EFFECT TRANSISTORS IN THE OHMIC REGION

TECHNICAL FIELD

The disclosed technology relates to electronic systems, and more particularly, to circuits that include one or more field effect transistors.

DESCRIPTION OF THE RELATED TECHNOLOGY

Electronic systems can use field effect transistors as resistors. For example, in a programmable filter, a plurality of field effect transistors can be used as resistors to create one or more variable resistance circuits. In such an application, a resistance of a variable resistance circuit can be adjusted by turning one or more of the plurality of field effect transistors on and/or off. When the plurality of field effect transistors are arranged in parallel, an effective resistance of the variable resistance circuit can be reduced by turning one or more of the field effect transistors on, as this can add additional resistance in parallel. Conversely, when the plurality of transistors are arranged in parallel, an effective resistance of the variable resistance circuit can be increased by turning one or more of the field effect transistors off. Adjusting the resistance of the variable resistance circuit can, for example, adjust the bandwidth of the programmable filter.

It can be advantageous for a field effect transistor to behave as a linear resistor. However, in certain applications, conventional circuits that use field effect transistors have shown undesirable linearity characteristics as resistors. Accordingly, a need exists for improving the linearity of field effect transistors as resistive circuit elements.

SUMMARY OF CERTAIN INVENTIVE ASPECTS

In one embodiment, an apparatus includes a field effect transistor, a first series circuit, and a second series circuit. The field effect transistor has a gate, a source, and a drain. The first series circuit can be in parallel with the gate and the source of the field effect transistor. The first series circuit can include a first capacitor and a first switch in series with the first capacitor. The first switch can be configured to be on when the field effect transistor is on, and to be off when the field effect transistor is off. The second series circuit can be in parallel with the gate and the drain of the field effect transistor. The second series circuit can include a second capacitor and a second switch in series with the second capacitor. The second switch can be configured to be on when the field effect transistor is on, and to be off when the field effect transistor is off.

In some implementations, the apparatus can include a resistor having a first end and a second end, the first end electrically coupled to the gate of the field effect transistor. According to certain implementations, the field effect transistor is an NMOS device. In various implementations, a capacitance of the first capacitor is approximately equal to a capacitance of the second capacitor. In accordance with a number of implementations, the first series circuit and the second series circuit are configured to provide an averaging voltage to the gate of the field effect transistor when the first switch and the second switch are on, the averaging voltage including an average of a voltage at the drain of the field effect transistor and a voltage at the source to the gate of the field effect transistor. In some implementations, the first switch is electrically coupled in series between the first capacitor and the source of the field effect transistor. According to certain implementations, the first switch includes a first field effect transistor, and the second switch includes a second field effect transistor. In some of these implementations, the field effect transistor has a width that is at least about twice as large as a width of the first field effect transistor and/or the gate of the field effect transistor is electrically coupled to a gate of the first field effect transistor and a gate of the second field effect transistor. According to a number of implementations, the field effect transistor is configured to operate in the linear mode of operation when on.

In another embodiment, an apparatus includes a variable resistance circuit configured to generate an output based on an input and a plurality of control signals. The variable resistance circuit can include a plurality of linear resistance circuits. Each linear resistance circuit can include a field effect transistor, a first series circuit, and a second series circuit. The field effect transistor has a gate, a source, and a drain. The gate can be controlled by a control signal of the plurality of control signals, the drain can be configured to receive the input, and the source can be configured to drive the output when the field effect transistor is on. The first series circuit can be in parallel with the gate and the source of the field effect transistor. The first series circuit can include a first capacitor and a first switch in series with the first capacitor. The first switch can be configured to be on when the field effect transistor is on, and to be off when the field effect transistor is off. The second series circuit can be in parallel with the gate and the drain of the field effect transistor. The second series circuit can include a second capacitor and a second switch in series with the second capacitor. The second switch can be configured to be on when the field effect transistor is on, and to be off when the field effect transistor is off. Each of the plurality of linear resistance circuits can be configured to switch the field effect transistor based on one of the plurality of control signals.

In some implementations, the variable resistance circuit is embodied in a programmable filter. According to a number of implementations, the apparatus also includes an analog to digital converter wherein the output of the variable resistance circuit is provided as an input to the analog to digital converter. In accordance with various implementations, the field effect transistor of a first linear resistance circuit of the plurality of linear resistance circuits has a width that is a multiple of a width of the field effect of a second linear resistance circuit of the plurality of linear resistance circuits, and the multiple is a positive integer power of two. In some implementations, the variable resistance circuit is configured to adjust the bandwidth of the output by selectively activating the field effect transistors in the plurality of linear resistance circuits based at least partly on states associated with the plurality of control signals. According to certain implementations, the output of the variable resistance circuit has a bandwidth ranging from about 5 MHz to 40 MHz.

In another embodiment, a method of using a field effect transistor is provided. The method can include controlling activation of the field effect transistor based at least partly on one or more control signals, the field effect transistor having a gate, a source, and a drain; filtering an input signal with the field effect transistor when the field effect transistor operates in the ohmic region; and controlling filtering such that: a first switch electrically couples a first capacitor in parallel with the gate and the drain of the field effect transistor when the field effect transistor is on, and the first switch does not electrically couple the first capacitor in parallel with the gate and the drain of the field effect transistor when the field effect transistor is off; and a second switch electrically couples a second capacitor in parallel with the gate and the source of the field effect transistor when the field effect transistor is on, and the second switches does not electrically couple the first capacitor in parallel with the gate and the source of the field effect transistor when the field effect transistor is off.

In some implementations, the method can also include isolating a parasitic capacitance between the gate and the drain and a parasitic capacitance between the gate and the source from alternating current ground via an isolation resistor. According to certain implementations, controlling filtering includes providing an average of a voltage at the drain of the field effect transistor and a voltage at the source to the gate of the field effect transistor when the first switch and the second switch are on. In various implementations, the first switch includes a first field effect transistor having a gate, a source, and a drain, and the gate of the field effect transistor is electrically coupled to the gate of the first field effect transistor.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF CERTAIN EMBODIMENTS

Figure 1A:
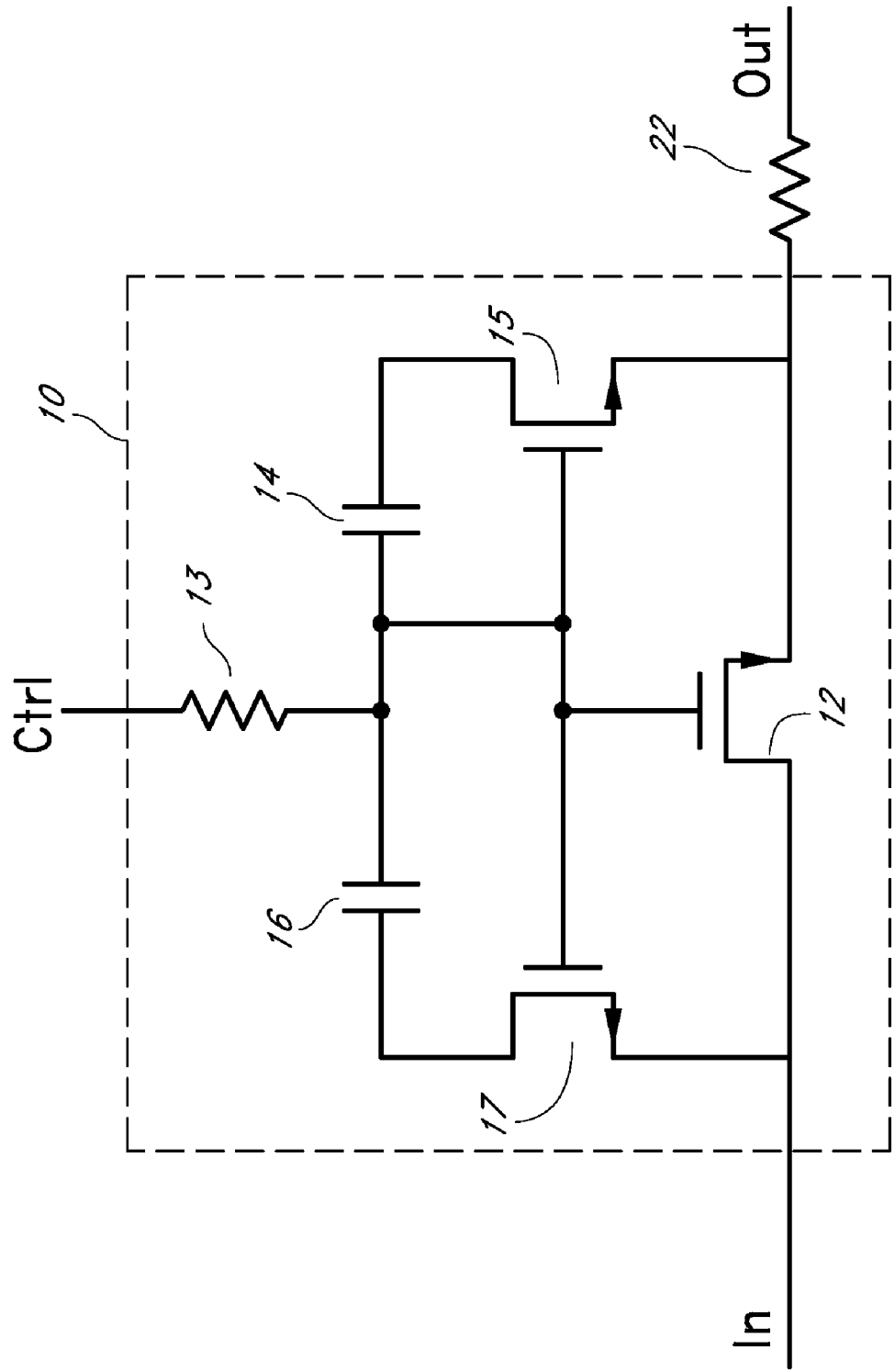
FIG. 1A is a schematic diagram illustrating a linear resistance circuit including a field effect transistor, according to an embodiment.

The following detailed description of certain embodiments presents various descriptions of specific embodiments of the invention. However, the invention can be embodied in a multitude of different ways as defined and covered by the claims. In this description, reference is made to the drawings where like reference numerals indicate identical or functionally similar elements.

As discussed above, an electronic system can utilize field effect transistors, such as NMOS devices, as resistors. Parasitic capacitances of the field effect transistor (for example, from gate to source and/or from gate to drain) can reduce a bandwidth for which the field effect transistor operates as a linear resistor. An isolation resistor can be added, for example, to isolate these parasitic capacitances from alternating current (AC) ground. By adding additional capacitance, the field effect transistor can be linearized by applying an average of the voltages at the source and the drain of the field effect transistor to the gate of the field effect transistor.

The isolation resistor should have a resistance that is sufficiently large to allow this average value to be applied to the gate of the field effect transistor in a desired frequency range. For example, at lower frequencies, an isolation resistor with a relatively large resistance value may be used to implement the averaging function. As the resistance of the isolation resistor is increased, a capacitance of the isolation resistor can attenuate a signal at the gate of the field effect transistor. Thus, the parasitic capacitance of the isolation resistor can set an upper limit on an acceptable resistance value of the isolation resistor. Further, problems related to intermodulation distortion have been observed with respect to bandwidth. For example, intermodulation distortion of a third harmonic has been encountered near a corner frequency of a programmable filter that utilizes field effect transistors as resistors.

Additional capacitors can be added in parallel with the parasitic capacitance between the gate and source and the gate and drain of the field effect transistor. These additional capacitors can reduce the attenuation and allow the average of the source voltage and the drain voltage to be applied to the gate. Moreover, the additional capacitors can implement the averaging function at lower frequencies using reduced isolation resistor values. While the intermodulation distortion can improve by adding the additional capacitors, an AC frequency response can be degraded at higher frequencies. This degradation of the AC frequency response can be due to the additional capacitance of the additional capacitors while the field effect transistor is off.

The additional capacitors can be disconnected when the field effect transistor is off. For example, switches, such as field effect transistors, can be connected in series with the additional capacitors to selectively connect/disconnect the additional capacitors to the gate and source and/or the gate and drain of the field effect transistor. In this way, the additional capacitors can be electrically disconnected so as to not add to a feed forward path capacitance that includes the parasitic capacitances of the switching field effect transistor when the switching field effect transistor is off. In addition, the additional capacitors can be connected while the field effect transistor is on to improve the linearity of the field effect transistor that is acting as a resistor. Advantageously, such a circuit can improve intermodulation distortion without degrading the AC frequency response at higher frequencies. Accordingly, the field effect transistor can operate more linearly as a resistor over a greater range of frequencies.

Figure 1B:
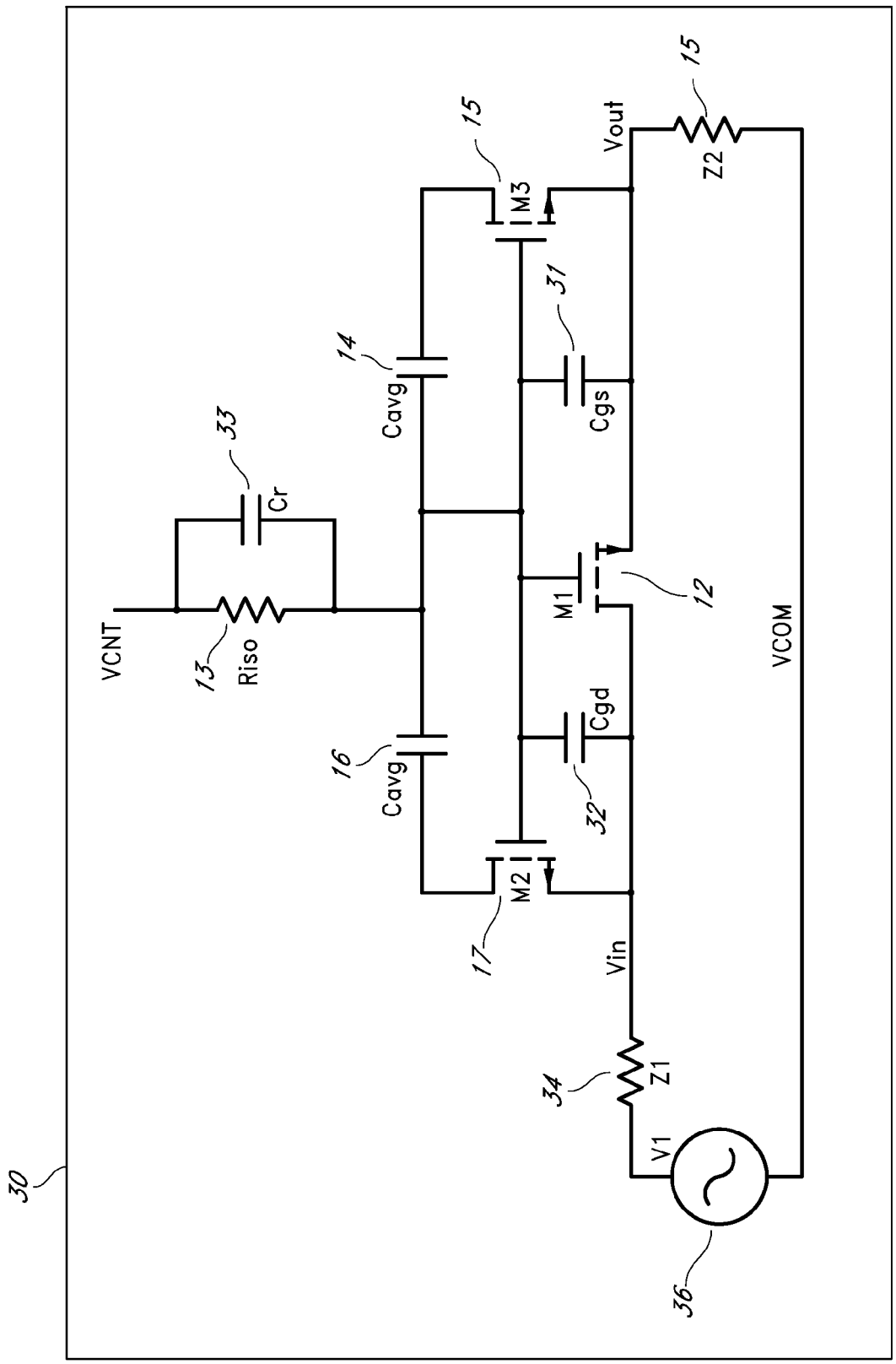
FIG. 1B is a schematic diagram of a parasitic model of the circuit of FIG. 1A.

With reference to FIGS. 1A and 1B, one example of a linear resistance circuit will be described. For illustrative purposes, a linear resistance circuit 10 of FIG. 1A will also be described with reference to a parasitic model 30 of FIG. 1B. A control signal Ctrl can selectively control the linear resistance circuit 10 so as to generate an output Out having a linear relationship with an input In when the control signal Ctrl is asserted. When the control signal Ctrl is not asserted, the linear resistance circuit 10 does not generate the output Out. The linear relationship may be between a current provided to the input In and a potential difference (i.e., a voltage) between the input node In and the output node Out. The linear relationship may result from a field effect operating in the linear region, which may also be referred to as the "ohmic region." In such an example, the linear relationship may be between a current provided to a drain of the field effect transistor $I_D$ and the voltage from the drain to a source $V_{DS}$ of the field effect transistor. By operating the field effect transistor in the linear region, the field effect transistor may be used as a linear resistor. A plurality of linear resistance circuits can be arranged to implement, for example, a variable resistance circuit. An illustrative variable resistance circuit will be described later with reference to FIG. 4.

The linear resistance circuit 10 can include a field effect transistor 12 having a gate, a source, and a drain. It will be understood that, in some implementations, the source and the drain of a field effect transistor can be substantially the same physical structure, and that the way in which the field effect transistor 12 is configured can determine which terminal is the source and which terminal is the drain. Thus, in the following description, the terms "source" and "drain" can be interchanged in accordance with certain implementations. The linear resistance circuit 10 can also include an isolation resistor 13, a first series circuit including a first capacitor 14 and a first switch 15, and a second series circuit including a second capacitor 16 and a second switch 17. An output resistor 22 can be included in series with the linear resistance circuit 10 and the output node Out.

The field effect transistor 12 can be any suitable field effect transistor. In some implementations, the field effect transistor 12 can represent two or more field effect transistors in series and/or parallel. Although an NMOS transistor is illustrated in FIG. 1A, a PMOS transistor can alternatively be used. In some instances, the field effect transistor 12 can be a metal oxide field effect transistor (MOSFET). In other instances, the field effect transistor can be, for example, a CNFET, a DEPFET, a DNAFET, a FREDFET, a HEMT, an IGBT, an ISFET, a JFET, a MESFET, a MODFET, a NOMFET, an OFET, or the like. Moreover, the field effect transistor can be formed using any suitable process, such as bulk CMOS or silicon on insulator (SOI), among others.

The field effect transistor 12 can be modeled as a resistor when operating in the linear region. In general, a field effect transistor operates in the linear region when a voltage from gate to source $V_{GS}$ is greater than the threshold voltage $V_T$ and a voltage from drain to source $V_{DS}$ is less than a voltage from gate to source $V_{GS}$ minus the threshold voltage $V_T$. The current at the drain $I_D$ in relation to $V_{DS}$ can be modeled by Equation 1:

$$I_D = \mu C_{ox} \frac{W}{L}\left(V_{GS} - V_T - \frac{V_{DS}}{2}\right)V_{DS} \quad \text{(Eq. 1)}$$

In Equation 1, $I_D$ can represent the current at the drain of the field effect transistor 12, $\mu$ can represent a charge-carrier effective mobility, $C_{OX}$ can represent an oxide capacitance of the gate of the field effect transistor 12 per unit of area, $V_{GS}$ can represent the voltage from the gate to the source of the field effect transistor 12, $V_T$ can represent the threshold voltage of the field effect transistor 12, and $V_{DS}$ can represent the voltage from the drain to the source of the field effect transistor 12.

With reference to the parasitic model 30, the voltages at the gate $V_G$, the source $V_S$ and the drain $V_D$ of the field effect transistor 12 can be represented by Equations 2-4:

$$V_G = V_{CTRL} + \frac{(V_{IN} + V_{OUT})}{2} \quad \text{(Eq. 2)}$$

$$V_S = V_{COM} + V_{OUT} \quad \text{(Eq. 3)}$$

$$V_D = V_{COM} + V_{IN} \quad \text{(Eq. 4)}$$

In Equations 2-4, $V_{CTRL}$ can represent a voltage of the control signal Ctrl provided to the gate of the field effect transistor 12 and $V_{COM}$ can represent a common reference voltage from which Vin and Vout can be referenced (for example, ground), as shown in the parasitic model 30. The parasitic capacitances from the gate to drain $C_{GD}$ 32 and gate to source $C_{GS}$ 31 shown in FIG. 1B can be roughly equal to each other. In this way, the average of the input voltage Vin and the output voltage Vout can be added to the control voltage $V_{CTRL}$ at the gate of the field effect transistor 12 via capacitive coupling, as shown in equation.

From Equations 2-4, the gate-to-source voltage $V_{GS}$ of the field effect transistor 12 and the drain-to-source voltage $V_{DS}$ of the field effect transistor 12 can be represented by Equations 5 and 6, below:

$$V_{GS} = V_{CTRL} - V_{COM} + \frac{(V_{IN} - V_{OUT})}{2} \quad \text{(Eq. 5)}$$

$$V_{DS} = V_{IN} - V_{OUT} \quad \text{(Eq. 6)}$$

By substituting the gate-to-source voltage $V_{GS}$ of the field effect transistor 12 and the voltage from drain to source $V_{DS}$ of the field effect transistor 12 from Equations 5 and 6 into Equation 1, a relationship between the current at the drain $I_D$ in relation to the drain-to-source voltage $V_{DS}$ can be represented by Equation 7:

$$Id = \mu C_{ox} \frac{W}{L}(V_{CTRL} - V_{COM} - V_T) * V_{DS} \quad \text{(Eq. 7)}$$

As shown by Equation 7, the field effect transistor 12 can behave as a linear resistor, and a linear relationship can exist between the current at the drain $I_D$ and the drain-to-source voltage $V_{DS}$. By operating in the linear region, the $V_{DS}$ squared term of Equation 1 can drop out, improving linearity. Equations 1 to 7 can be valid when the following relationship expressed in Equation 8 holds true:

$$V_{DS} < 2(V_{CTRL} - V_{COM} - V_T) \quad \text{(Eq. 8)}$$

Referring back to FIG. 1A, the isolation resistor 13 can have a first end and a second end. The control signal Ctrl can be provided to the first end of the isolation resistor 13, and the second end of the isolation resistor 13 can be electrically coupled to the gate of the field effect transistor 12. The parasitic capacitance 31 between the gate and source and parasitic capacitance 32 between the gate and drain illustrated in FIG. 1B can reduce a bandwidth of frequencies at which the field effect transistor 12 operates as a linear resistor. The isolation resistor 13 can isolate the parasitic capacitance 31 between the gate and source and the parasitic capacitance 32 between the gate and drain from alternating current (AC) ground. The isolation resistor 13 can also linearize the field effect transistor 12 by allowing the parasitic capacitances 31, 32 between gate and source and gate and drain to add the average of voltages Vin and Vout shown in FIG. 1B to the gate voltage.

In addition to having a resistance Riso, the isolation resistor 13 can also have a parasitic capacitance $C_R$ 33, as shown in the parasitic model 30 of FIG. 1B. As long as the parasitic capacitance $C_R$ 33 of the isolation resistor 13 is small compared to the parasitic capacitances from the gate to source $C_{GS}$ 31 and gate to drain $C_{GD}$ 32 of the field effect transistor 12, the resistance Riso of the isolation resistor 13 can be increased to allow the average signal to be added to the gate at a desired frequency of interest. The average signal can represent the average voltage of Vin and Vout. In an illustrative example, if $C_{GS}$ and $C_{GD}$ are about 50 fF each and Cr is about 10 fF for Riso of about 500K, the field effect transistor 12 can remain linear down to frequencies of around 3 MHz. In some implementations, the field effect transistor can operate linearly for frequencies ranging from about 5 MHz to 40 MHz.

However, as the resistance Riso of the isolation resistor 13 becomes larger, the parasitic capacitance $C_R$ 33 of the isolation resistor 13 can start to attenuate the voltage applied to the gate of the field effect transistor 12. Attenuating the voltage applied to the gate of the field effect transistor 12 can reduce the linearity of the relationship between current at the drain $I_D$ of the field effect transistor 12 and the voltage from the drain to the source $V_{DS}$ of the field effect transistor 12. Accordingly, this attenuation can reduce the linearity of the field effect transistor 12 when the field effect transistor 12 operates in the linear region. In some instances, a resistive drop from the drain to the source of the field effect transistor 12 can be close to zero when the field effect transistor 12 is on. This implies that Vin equals Vout in the parasitic model 30. Assuming that Vin equals Vout in the parasitic model 30, the voltage $V_G$ at the gate of the field effect transistor 12 can be modeled by Equation 9:

$$V_G = V_{IN} \frac{C_{GS} + C_{GD}}{C_R + C_{GS} + C_{GD}} \cdot \frac{1}{1 + \frac{1}{sR_{ISO} \cdot (C_{GS} + C_{GD} + C_R)}} \quad \text{(Eq. 9)}$$

According to Equation 9, a larger parasitic capacitance $C_R$ of the isolation resistor 13 can increase a difference between the gate voltage $V_G$ of the field effect transistor 12 and the input voltage $V_{IN}$, thereby reducing the linearity of the field effect transistor 12 as a resistor. As discussed earlier, when the resistance of the isolation resistor 13 is increased, the field effect transistor 12 can operate as a linear resistor for a larger frequency band (for example, at lower frequencies). When the resistance Riso of the isolation resistor 13 increases, the parasitic capacitance $C_R$ of the isolation resistor 13 can also increase. In Equation 9, s can represent $j2\pi f$.

In accordance with Equation 9, increasing the gate to source capacitance $C_{GS}$ and the gate to drain capacitance $C_{GD}$ can bring $V_G$ closer to $V_{IN}$. The capacitance from the gate to the source $C_{GS}$ and the capacitance from the gate to the drain $C_{GD}$ can be approximately the same. One way to increase these capacitances is to increase a width of the field effect transistor 12 to increase the parasitic capacitances between gate and source 31 and gate and drain 32, as illustrated in the parasitic model 30 of FIG. 1B.

However, adding capacitance to from the gate to the source and/or the gate to the drain of the field effect transistor 12 can have undesirable effects. For example, adding capacitance can increase a delay in propagating a signal, which can be proportional to resistance times capacitance and may be referred to as an "RC delay." As another example, adding capacitance can result in more charge being switched, which can lead to greater power consumption. More specifically, the added capacitance can increase a capacitance of a feed forward path, which already includes the capacitance from the gate to the source $C_{GS}$ and the capacitance from the gate to the drain $C_{GD}$, when the field effect transistor 12 is off. Moreover, when the width of the field effect transistor 12 is increased, more die area is consumed, increasing manufacturing cost.

In certain implementations, the benefits of adding additional capacitance across the gate to source and across gate to drain of the field effect transistor 12 may be realized when the field effect transistor 12 is passing current in the on state, for example, when the field effect transistor 12 is operating in the linear mode. Yet when the field effect transistor 12 is in the off state, this additional capacitance may exhibit more undesirable effects than desirable effects. However, increasing the width of the field effect transistor 12 may exhibit such undesirable effects when the field effect transistor is off. Advantageously, the linear resistance circuit 10 can be configured such that the additional capacitance can selectively electrically couple the gate and source and gate and drain of the field effect transistor 12 only when the field effect transistor 12 is on. Accordingly, when the field effect transistor 12 is off, the linear resistance circuit 10 can overcome one or more of the undesirable effects of adding capacitance to from the gate to the source and/or the gate to the drain of the field effect transistor 12.

Referring to FIG. 1A, the linear resistance circuit 10 can include a first series circuit in parallel with the gate and the source of the field effect transistor 12 and a second series circuit in parallel with the gate and the drain of the field effect transistor. The first series circuit can include a first capacitor 14 and a first switch 15. Similarly, the second series circuit can include a second capacitor 16 and a second switch 17. In some instances, the first capacitor 14 and the second capacitor 16 can be different instantiations of substantially the same circuit elements configured with different electrical connections. For example, these capacitors may have substantially the same capacitance values. Alternatively or additionally, the first switch 15 and the second switch 17 can be different instantiations of substantially the same circuit elements configured with different electrical connections.

The first capacitor 14 and the second capacitor 16 can be referred to as "averaging capacitors" because these capacitors can serve such that the average of the input voltage Vin and the output voltage Vout can be added to the control voltage $V_{CTRL}$ at the gate of the field effect transistor 12 via capacitive coupling, as shown in equation (2). The first capacitor 14 and the second capacitor 16 can include any suitable circuit elements having a pair of conductive elements separated by a dielectric so as to store charge when a voltage is applied across the pair of conductive elements. For example, a capacitor formed in and/or over a substrate of an integrated circuit can be used for the first capacitor 14 and/or the second capacitor 16. In some instances, the first capacitor 14 and/or the second capacitor 16 can represent two or more circuit elements, for example, two or more capacitors in series and/or parallel. In some implementations, the first capacitor 14 and the second capacitor 16 each have capacitances that are larger than either $5*(C_R-C_{GS})$ or $1/(2\pi*Riso*f)-(C_R+C_{GS})$, in which f can represent the frequency of interest. In some of these implementations, the first capacitor 14 and the second capacitor 16 each have capacitances that are greater than both $5*(C_R-C_{GS})$ and $1/(2\pi*Riso*f)-(C_R+C_{GS})$.

The first switch 15 can include any suitable switch to operatively couple the first capacitor 14 in parallel with the gate and the source of the field effect transistor 12. Similarly, the second switch 17 can include any suitable switch to operatively couple the second capacitor 16 in parallel with the gate and the drain of the field effect transistor 12. In some instances, the first switch 15 and/or the second switch 17 can represent two or more circuit elements, for example, two or more switches in series and/or parallel. The first switch 15 and/or the second switch 17 can be voltage controlled switches. In certain implementations, the first switch 15 and/or the second switch 17 can include transistors, such as field effect transistors. Generally, the first switch 15 and the second switch 17 are small devices. This can be because they carry a small amount of current set by the signal voltage at Vin divided by the impedance of the isolation resistor Riso in parallel with the impedance of the parasitic capacitance $C_R$ 33. Advantageously, the first switch 15 and the second switch 17 can be small, so as to not to introduce too much parasitic at Vin and Vout.

With continued reference to FIG. 1A, the first capacitor 14 can have a first end and a second end. Similarly, the second capacitor 16 can have a first end and a second end. In some implementations, the first end of the first capacitor 14 and the first end of the second capacitor 16 can be electrically coupled to the isolation resistor 13. The first end of the first capacitor 14 and the first end of the second capacitor 16 can be electrically coupled to the gate of the field effect transistor 12.

The second end of the first capacitor 14 can be electrically coupled to a first terminal of the first switch 15, which can be a source of a field effect transistor in certain implementations. A second terminal of the first switch 15 can be electrically coupled to the source of the field effect transistor 12. In some implementations, the second terminal of the first switch 15 can be a drain of a field effect transistor.

The second end of the second capacitor 16 can be electrically coupled to a first terminal of the second switch 17, which can be a source of a field effect transistor in certain implementations. A second terminal of the second switch 17 can be electrically coupled to the drain of the field effect transistor 12. In some implementations, the second terminal of the second switch 17 can be a drain of a field effect transistor.

A third terminal of the first switch 15 and a third terminal of the second switch 17 can be electrically coupled to the gate of the field effect transistor 12. The third terminal of the first switch 15 and the third terminal of the second switch 17 can be configured to receive a voltage to control whether the first switch 15 and the second switch 17 are on or off. In this way, the first capacitor 14 can be selectively electrically coupled in parallel with the gate and the drain of the field effect transistor 12 when the field effect transistor is on, but not when the field effect transistor in off. Similarly, the second capacitor 16 can also be selectively electrically coupled in parallel with the gate and the source of the field effect transistor 12 when the field effect transistor is on, but not when the field effect transistor in off. In some implementations, the third terminal of the first switch 15 can be a gate of a field effect transistor and the third terminal of the second switch 17 can also be a gate of a field effect transistor.

By electrically coupling the first capacitor 14 having a capacitance of $C_{AVG}$ in parallel with the gate and the drain of the field effect transistor 12 and electrically coupling the second capacitor 16 having a capacitance of $C_{AVG}$ in parallel with the gate and the source of the field effect transistor 12, the attenuation of the voltage $V_G$ applied to the gate of the field effect transistor 12 can be reduced. In the circuit shown in the parasitic model 30 of FIG. 1B, the voltage $V_G$ applied to the gate of the field effect transistor 12 can be represented by Equation 10:

$$V_G = V_{IN} \frac{C_{GS} + C_{GD} + 2 \cdot C_{AVG}}{C_R + C_{GS} + C_{GD} + 2 \cdot C_{AVG}} \cdot \frac{1}{1 + \frac{1}{s \cdot R_{ISO} \cdot (C_{GS} + C_{GD} + 2 \cdot C_{AVG} + C_R)}} \quad \text{(Eq. 10)}$$

As shown in Equation 10, the additional capacitance of the first capacitor 14 and the second capacitor 16 of $2C_{AVG}$ can bring the voltage $V_G$ at the gate of the field effect transistor 12 closer to the voltage $V_{IN}$ at the drain of the field effect transistor 12. This can improve the linearity of the field effect transistor 12 as a resistor.

Figure 2:
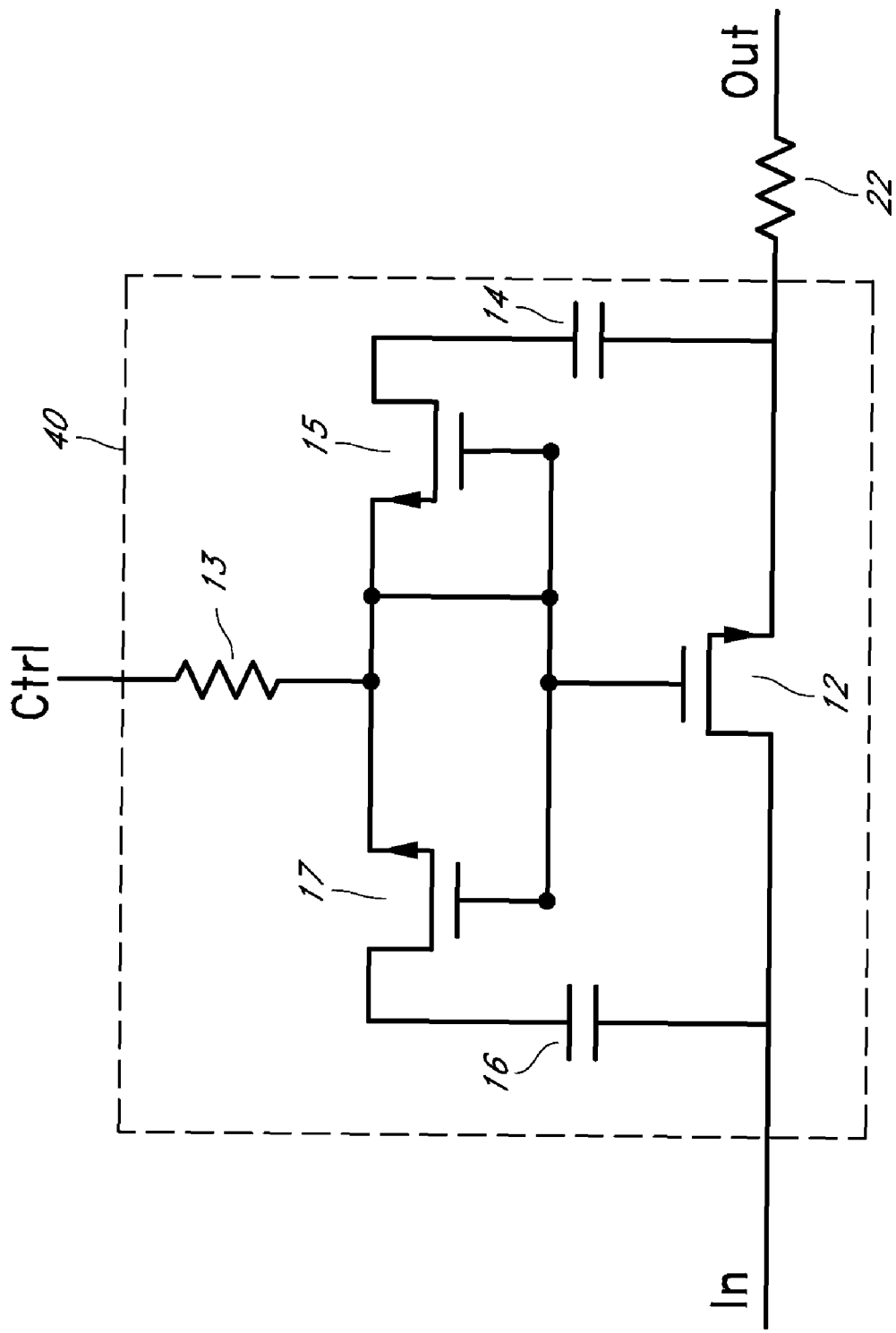
FIG. 2 is a schematic diagram illustrating another linear resistance circuit including a field effect transistor, according to another embodiment.

FIG. 2 is a schematic diagram illustrating another linear resistance circuit 40 including a field effect transistor 12, according to another embodiment. The linear resistance circuit 40 is one example of a number of alternative embodiments of the linear resistance circuit 10. The linear resistance circuit 40 can be substantially the same as the linear resistance circuit 10 with the exception of the first series circuit and the second series circuit. Although the first series circuit and the second series circuit of FIG. 2 each include a capacitor and a switch, the connections between and capacitors and the switches are different than in FIG. 1A.

More specifically, the first series circuit can include the first capacitor 14 and the first switch 15. Similarly the second series circuit can include the second capacitor 16 and the second switch 17. A first terminal of the first switch 15 (for example, a drain of a field effect transistor) and a first terminal of the second switch 17 (for example, a drain of a field effect transistor) can be electrically coupled to the isolation resistor 13. A second terminal of the first switch 15 (for example, a gate of a field effect transistor) and a second terminal of the second switch 17 (for example, a gate of a field effect transistor) can be electrically coupled to the gate of the field effect transistor 12. A third terminal of the first switch 15 (for example, a source of a field effect transistor) can be electrically coupled to a first end of the first capacitor 14. A second end of the first capacitor 14 can be electrically coupled to the source of the field effect transistor 12. A third terminal of the second switch 17 (for example, a source of a field effect transistor) can be electrically coupled to a first end of the second capacitor 16. A second end of the second capacitor 16 can be electrically coupled to the drain of the field effect transistor 12.

Figure 3:
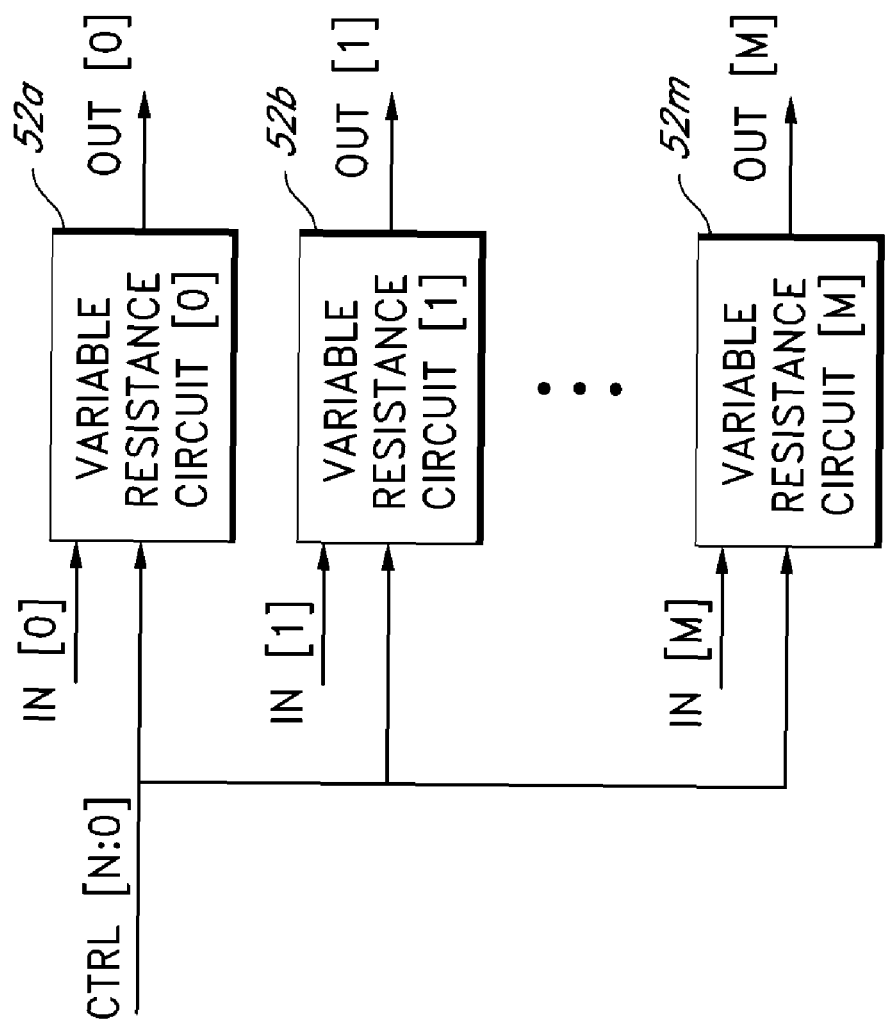
FIG. 3 is a block diagram of a plurality of variable resistance circuits.

FIG. 3 illustrate a plurality of variable resistance circuits 52a-52m that can be implemented using a plurality of linear resistance circuits, for example, the linear resistance circuits 10 and/or 40 described earlier. The variable resistance circuits 52a-52m can be used in any applications with a need for a variable resistance circuit, such as in a programmable filter. Although a plurality of variable resistance circuits 52a-52m are shown in FIG. 3, in other implementations, only one variable resistance circuit may be utilized. Any suitable number of variable resistance circuits can be used together as appropriate. For example, in some implementations, 2, 3, 4, 6, 8, 10, 12, or 16 variable resistance circuits can be used in a programmable filter application.

A variable resistance can be generated using a plurality of linear resistance circuits. Each linear resistance circuit can be activated by a control signal. The control signal can provide additional resistance from one linear resistance circuit in parallel with other linear resistance circuits, thereby reducing resistance from an input (for example, IN[0]) to an output (for example, OUT[0]) of a variable resistance circuit. For example, the control signal can be provided to the gate of the field effect transistor 12 of FIG. 1A and/or FIG. 2. When the field effect transistor 12 is on, the resistance of a linear resistance circuit can be added in parallel with other linear resistance circuits, if any, that also include a field effect transistor 12 that is on. Similarly, when the field effect transistor 12 is off, the resistance of a linear resistance circuit can be excluded from the total resistance in parallel with other linear resistance circuits that also include a field effect transistor 12 that is on. In this way, resistance of the variable resistance circuit can be increased.

In some implementations, each linear resistance circuit can provide substantially the same resistance as at least one other linear resistance circuit in the variable resistance circuit. Alternatively or additionally, a linear resistance circuit can provide a different resistance than one or more other linear resistance circuits in the variable resistance circuit. According to some implementations, each linear resistance circuit in a variable resistance circuit can have a resistance that is a ratio of another linear resistance circuit. For instance, each linear resistance circuit can have double the resistance of the next linear resistance circuit.

By selectively adding the resistance of linear resistance circuits in parallel with other linear resistance circuits, a variable resistance circuit can be implemented. Each of the plurality of variable resistance circuits 52a-52m can receive a corresponding input signal (for example, variable resistance circuit 52a can receive IN[0]) and a plurality of control signals CTRL[N:0]. Each control signal can be provided to a different linear resistance circuit. The control signals CTRL[N:0] can selectively activate or deactivate a linear resistance circuit of a variable resistance circuit. When a linear resistance circuit is on, the linear resistance circuit can drive an output signal (for example, variable resistance circuit 52a can drive IN[0]) via a field effect transistor 12.

Each variable resistance circuit 52a-52m can receive a different input and generate a different output when activated. For instance, the variable resistance circuit 52a can generate OUT[0] from IN[0] and the variable resistance circuit 52m can generate OUT[M] from IN[M]. In some implementations, it may be desirable to provide one or more resistances using the variable resistance circuits 52a-52m that are integer multiples of resistances provided by other variable resistance circuits 52a-52m. In these implementations, each variable resistance circuit 52a-52m can receive the same logical control signals, for example, by receiving the same control signals CTRL[N:0].

Figure 4:
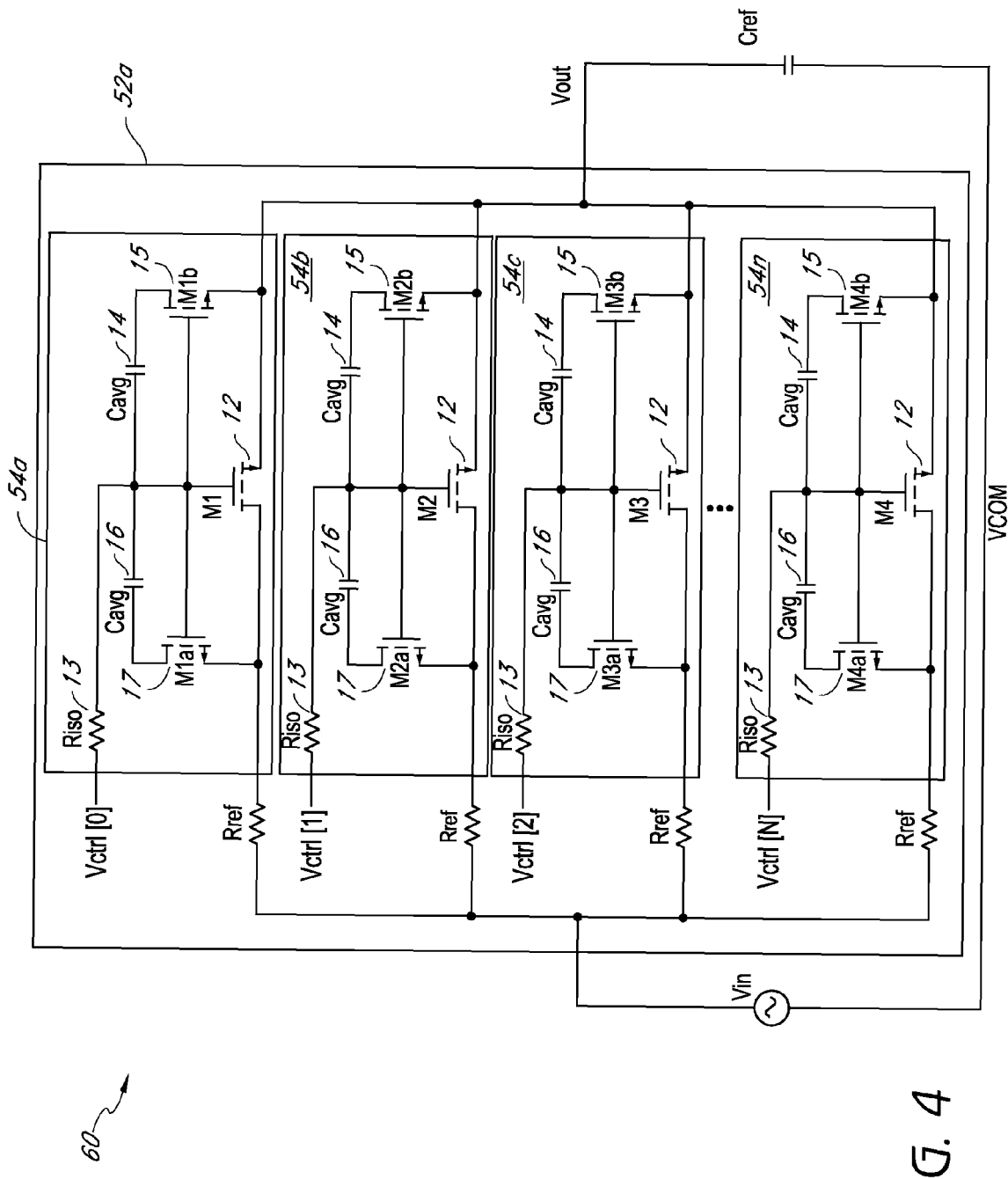
FIG. 4 illustrates an example programmable filter that includes a plurality of linear resistance circuits, according to an embodiment.

Referring to FIG. 4, an example of a programmable filter 60 that includes a variable resistance circuit 52a having a plurality of linear resistance circuits 54a-54n will be described. The linear resistance circuits 54a-54n can implement any combination of features described earlier in connection with the linear resistance circuits 10 and/or 40. Any suitable number of linear resistance circuits can be implemented. For instance, in some implementations, 4, 8, 16, or 32 linear resistance circuits can be utilized. The programmable filter 60 can adjust the bandwidth of an input signal Vin passed through the programmable filter 60 by activating and/or deactivating one or more linear resistance circuits 54a-54m.

A programmable filter that includes one or more variable resistance circuits 52a-52m can be any suitable filter with a need for a variable resistance circuit. For instance, such a programmable filter can be a low pass filter, a band pass filter, and/or a high pass filter. The illustrated programmable filter 60 can be used as a low pass filter. The programmable filter 60 can be programmed using the control signals CTRL[N:0] to adjust a cutoff frequency below which signals are passed and above which signals are attenuated by reducing their amplitude.

In a non-limiting example, when the programmable filter 60 includes four linear resistance circuits 54a-54n, the cutoff frequency of the programmable filter 60 can be from approximately 1.25 MHz to 5 MHz in certain implementations. Although a programmable filter 60 with a cutoff frequency from about 1.25 MHz to 5 MHz will be described for illustrative purposes, many other cutoff frequencies can be implemented in connection with the programmable filter 60. For instance, some programmable filters can have a cutoff frequency ranging from about 5 MHz to 40 MHz. When the field effect transistor M1 of the linear resistance circuit 54a is on and the filed effect transistors M2, M3, and M4 of the linear resistance circuits 54a, 54b, 54m, respectively, are off, the cutoff frequency can be approximately 1.25 MHz. Generally, when only one linear resistance circuit is activated by having a field effect transistor driving the output on, the filter can have a lowest programmable cutoff frequency because the variable resistance circuit has the highest resistance. Conversely, when all of the linear resistance circuits are activated by their respective control signals, the filter can have the highest programmable cutoff frequency because the parallel resistances of the linear resistance circuits will create the lowest resistance for the variable resistance circuit. With reference to the non-limiting example with four linear resistance circuits, when the field effect transistors M1, M2, M3, and M4 are all on, the cutoff frequency can be approximately 5 MHz.

In a general case, the programmable filter 60 can have a cutoff frequency that is represented by Equation 11:

$$\text{cutoff frequency} = \frac{n}{2\pi * R_{REF} * C_{REF}} \quad \text{(Eq. 11)}$$

In Equation 11, n can represent the number of linear resistance circuits having substantially the same resistance, Rref can represent a resistance between the input Vin and a drain of the field effect transistor of a linear resistance circuit driving the output Vout, and Cref can represent a capacitance coupling the output Vout to the common voltage Vcom (for example, ground).

Figure 5:
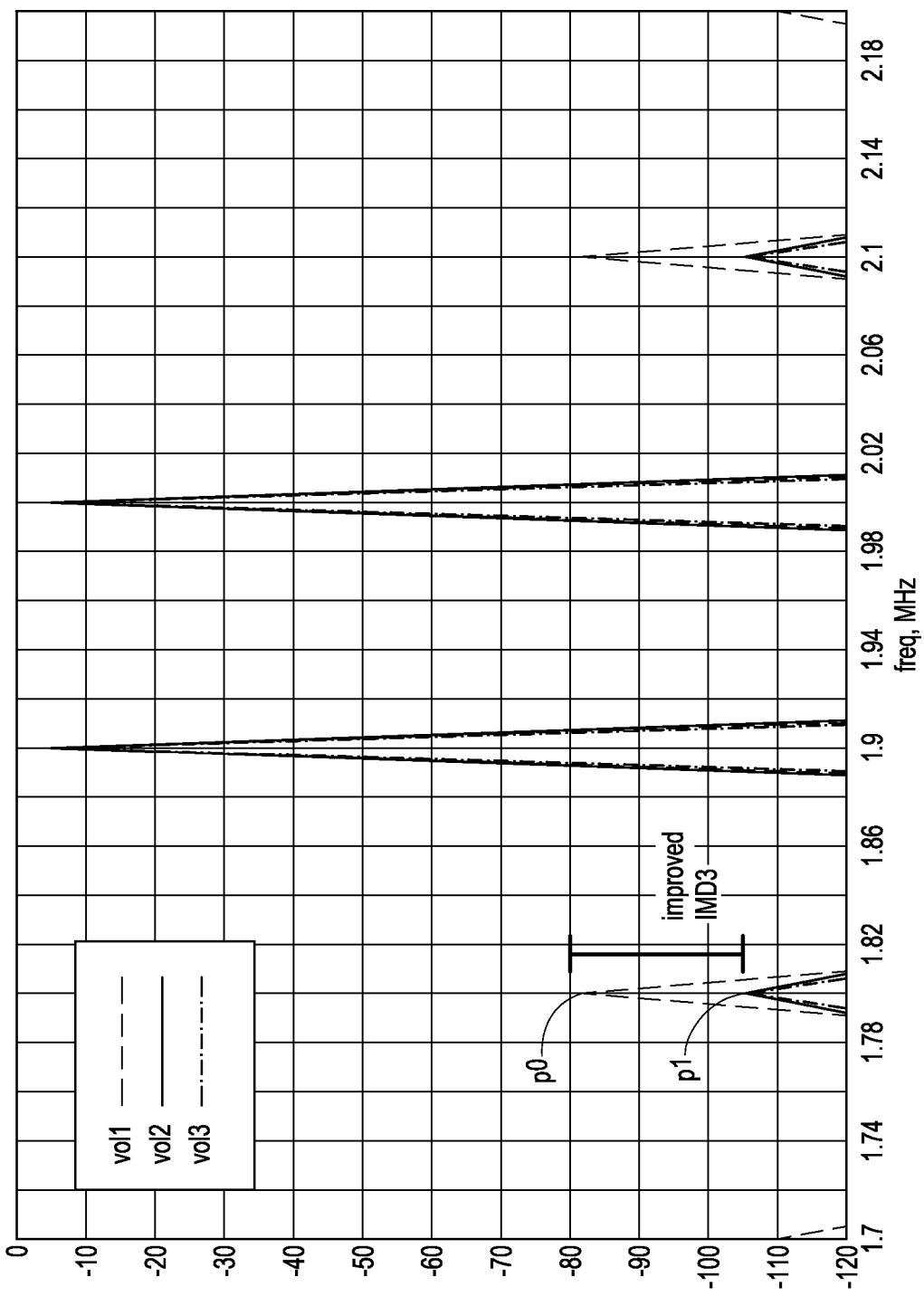
FIG. 5 is a graph illustrating a relationship among frequency responses of programmable filters that shows improvement in intermodulation distortion of a third harmonic according to an embodiment.

FIG. 5 is a graph illustrating a relationship among frequency responses of programmable filters that shows improvement in intermodulation distortion of a third harmonic according to an embodiment. FIG. 5 illustrates three curves vol1, vol2, and vol3. The curves vol1, vol2, and vol3 correspond to a temperature of 27 degrees Celsius. Vcol1 is a curve of a frequency response of a programmable filter with linear resistance circuits without averaging capacitors. In contrast, vol2 is a curve of a frequency response of a programmable filter with linear resistance circuits that includes averaging capacitors that are coupled to the gate and the drain of the field effect transistor 12 and the gate and the source of the field effect transistor 12 regardless of whether the field effect transistor 12 is on or off. Vol3 is a curve of a frequency response of a programmable filter that includes the linear resistance circuit 10 (FIG. 1) with averaging capacitors in the first series circuit in parallel with the gate and the source of the field effect transistor 12 and the second series circuit in parallel with the gate and the drain of the field effect transistor 12, as described above.

As shown in FIG. 5, the averaging capacitors can reduce the intermodulation distortion of a third harmonic (IMD3). Reducing such a distortion can be advantageous because the distortion can be in the signal band, and the distortion may not be attenuated by the filter. In some instances, IMD3 can be a significant problem for narrow band signals because the distortion can be in the signal band. With reference to FIG. 5, the IMD3 of vol1 at point PO is about −80 dB. In contrast, the IMD3 of vol2 and vol3 at point P1 are about the same at slightly less than −105 dB. By subtracting the magnitude of the frequency response at 1.8 MHz, the improvement shown in IMD3 is greater than 20 dB for vol2 and vol3 compared to vol1. Thus, IMD3 can be improved by adding averaging capacitors between the source and gain of a field effect transistor 12 and the drain and gate of the field effect transistor 12. This can result in the field effect transistor 12 operating more linearly as a resistor.

Figure 6:
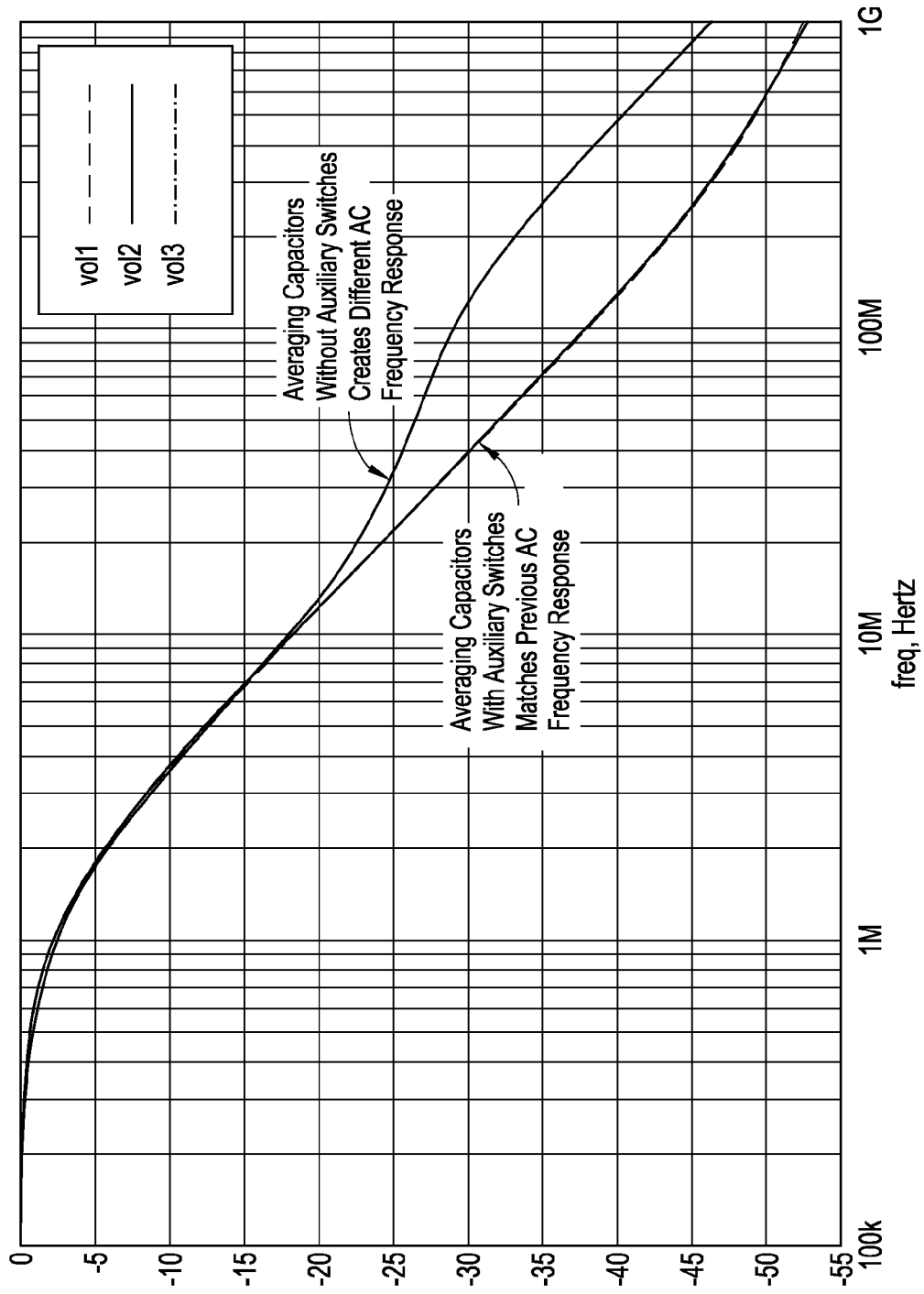
FIG. 6 is a graph illustrating a relationship among alternating current (AC) frequency responses of programmable filters that shows improved linearity at higher frequencies according to an embodiment.

In FIG. 6, the three illustrated curves vol1, vol2, and vol3 correspond to substantially the same circuits and the curves vol1, vol2, and vol3 of FIG. 5. As shown in FIG. 6, the AC frequency response of vol2 is disturbed at higher frequencies (for example, frequencies above about 10 MHz) than vol1 and vol3. Accordingly, averaging capacitors can cause an AC frequency response that is undesirable in some applications, when the averaging capacitors are coupled to the gate and the source of the field effect transistor 12 and the gate and the drain of the field effect transistor 12 when the field effect transistor 12 is off. Adding switches as part of a linear resistance circuit can result in the AC frequency response at higher frequencies to stay undisturbed, even though averaging capacitors are included, as shown by vol3.

Figure 7:
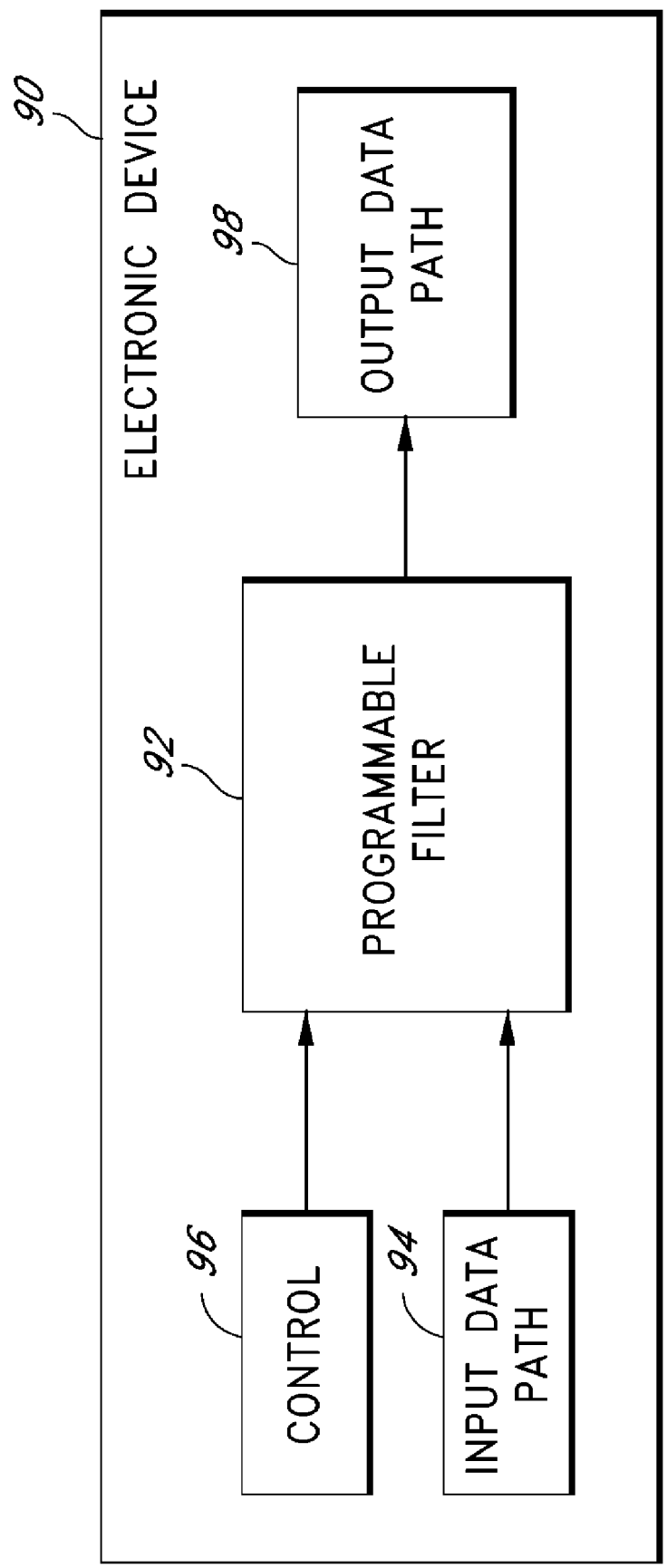
FIG. 7 is a block diagram of an example electronic device that includes a programmable filter.

FIG. 7 is a block diagram of an example electronic device that can implement any combination of features described herein. As shown in FIG. 7, an electronic device 90 can include a programmable filter 92, an input data path 94, control circuitry 96, and an output data path 98. The programmable filter can implement any combination of the principles and advantages described herein of the programmable filter 60, the variable resistance circuits 52a-52, and/or the linear resistance circuits 10 and/or 40. The programmable filter 92 can receive an input from input data path 94, which can include any suitable data path. The control circuitry 96 can generate one or more control signals used to control field effect transistors in one or more linear resistance circuits implemented in the programmable filter 92. The programmable filter can provide one or more outputs to an output data path 98. The output data path 98 can include any suitable circuit elements or logical blocks, for example, an analog to digital converter.

In the embodiments described above, systems with linear resistance circuits were described in conjunction with particular embodiments. A skilled artisan will, however, appreciate that the principles and advantages of the embodiments can be used for any other systems, apparatus, or methods with a need for linearizing a field effect transistor as a resistor.

Such methods, systems, and/or apparatus can be implemented into various electronic devices, such as the electronic device 90. Examples of the electronic devices can include, but are not limited to, consumer electronic products, parts of the consumer electronic products, electronic test equipments, etc. Examples of the electronic devices can also include memory chips, memory modules, circuits of optical networks or other communication networks, and disk driver circuits. The consumer electronic products can include, but are not limited to, wireless devices, a mobile phone (for example, a smart phone), cellular base stations, a telephone, a television, a computer monitor, a computer, a hand-held computer, a tablet computer, a personal digital assistant (PDA), a microwave, a refrigerator, a stereo system, a cassette recorder or player, a DVD player, a CD player, a digital video recorder (DVR), a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, etc. Further, the electronic device can include unfinished products.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." The words "coupled" or connected", as generally used herein, refer to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the Detailed Description using the singular or plural number may also include the plural or singular number, respectively. The words "or" in reference to a list of two or more items, is intended to cover all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of certain embodiments is not intended to be exhaustive or to limit the inventions to the precise form disclosed above. While specific embodiments of, and examples for, the inventions are described above for illustrative purposes, various equivalent modifications are possible within the scope of the invention, as those skilled in the relevant art will recognize.

The teachings of the invention provided herein can be applied to other systems, not necessarily the systems described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms. Furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure. Accordingly, the scope of the present inventions is defined only by reference to the appended claims.

What is claimed is:

1. An apparatus comprising:
a field effect transistor having a gate, a source, and a drain;
a first series circuit in parallel with the gate and the source of the field effect transistor, the first series circuit comprising:
a first capacitor; and
a first switch in series with the first capacitor, wherein the first switch is configured to be on when the field effect transistor is on, and to be off when the field effect transistor is off; and
a second series circuit in parallel with the gate and the drain of the field effect transistor, the second series circuit comprising:
a second capacitor; and
a second switch in series with the second capacitor, wherein the second switch is configured to be on when the field effect transistor is on, and to be off when the field effect transistor is off.

2. The apparatus of claim 1, further comprising a resistor having a first end and a second end, the first end electrically coupled to the gate of the field effect transistor.

3. The apparatus of claim 1, wherein the field effect transistor is an NMOS device.

4. The apparatus of claim 1, wherein a capacitance of the first capacitor is approximately equal to a capacitance of the second capacitor.

5. The apparatus of claim 1, wherein the first series circuit and the second series circuit are configured to provide an averaging voltage to the gate of the field effect transistor when the first switch and the second switch are on, the averaging voltage including an average of a voltage at the drain of the field effect transistor and a voltage at the source to the gate of the field effect transistor.

6. The apparatus of claim 1, wherein the first switch is electrically coupled in series between the first capacitor and the source of the field effect transistor.

7. The apparatus of claim 1, wherein the first switch comprises a first field effect transistor, and the second switch comprises a second field effect transistor.

8. The apparatus of claim 7, wherein the field effect transistor has a width that is at least about twice as large as a width of the first field effect transistor.

9. The apparatus of claim 7, wherein the gate of the field effect transistor is electrically coupled to a gate of the first field effect transistor and a gate of the second field effect transistor.

10. The apparatus of claim 1, wherein the field effect transistor is biased to operate in the linear mode of operation when on.

11. An apparatus comprising:
a variable resistance circuit configured to generate an output based on an input and a plurality of control signals, the variable resistance circuit comprising a plurality of linear resistance circuits, wherein each linear resistance circuit comprises:
a field effect transistor having a gate, a source, and a drain, the gate controlled by a control signal of the plurality of control signals, the drain configured to receive the input, and the source configured to drive the output when the field effect transistor is on;
a first series circuit in parallel with the gate and the source of the field effect transistor, the first series circuit comprising:
a first capacitor; and
a first switch in series with the first capacitor, wherein the first switch is configured to be on when the field effect transistor is on, and to be off when the field effect transistor is off; and
a second series circuit in parallel with the gate and the drain of the field effect transistor, the second series circuit comprising:
a second capacitor; and
a second switch in series with the second capacitor, wherein the second switch is configured to be on when the field effect transistor is on, and to be off when the field effect transistor is off;
wherein each of the plurality of linear resistance circuits is configured to switch the field effect transistor based on one of the plurality of control signals.

12. The apparatus of claim 11, wherein the variable resistance circuit is embodied in a programmable filter.

13. The apparatus of claim 11, further comprising an analog to digital converter wherein the output of the variable resistance circuit is provided as an input to the analog to digital converter.

14. The apparatus of claim 11, wherein the field effect transistor of a first linear resistance circuit of the plurality of linear resistance circuits has a width that is a multiple of a width of the field effect of a second linear resistance circuit of the plurality of linear resistance circuits, and wherein the multiple is a positive integer power of two.

15. The apparatus of claim 11, wherein the variable resistance circuit is configured to adjust the bandwidth of the output by selectively activating the field effect transistors in the plurality of linear resistance circuits based at least partly on states associated with the plurality of control signals.

16. The apparatus of claim 11, wherein the output has a bandwidth ranging from about 5 MHz to 40 MHz.

17. A method of using a field effect transistor, the method comprising:
controlling activation of the field effect transistor based at least partly on one or more control signals, the field effect transistor having a gate, a source, and a drain;
filtering an input signal with the field effect transistor when the field effect transistor operates in the ohmic region; and
controlling filtering such that:
a first switch electrically couples a first capacitor in parallel with the gate and the drain of the field effect transistor when the field effect transistor is on, and the first switch does not electrically couple the first capacitor in parallel with the gate and the drain of the field effect transistor when the field effect transistor is off; and
a second switch electrically couples a second capacitor in parallel with the gate and the source of the field effect transistor when the field effect transistor is on, and the second switch does not electrically couple the second capacitor in parallel with the gate and the source of the field effect transistor when the field effect transistor is off.

18. The method of claim 17, further comprising isolating a parasitic capacitance between the gate and the drain and a parasitic capacitance between the gate and the source from alternating current ground via an isolation resistor.

19. The method of claim 17, wherein controlling filtering includes providing an average of a voltage at the drain of the field effect transistor and a voltage at the source to the gate of the field effect transistor when the first switch and the second switch are on.

20. The method of claim 17, wherein the first switch includes a first field effect transistor having a gate, a source, and a drain, and wherein the gate of the field effect transistor is electrically coupled to the gate of the first field effect transistor.

* * * * *